United States Patent
Zhu et al.

(10) Patent No.: US 9,124,068 B1
(45) Date of Patent: Sep. 1, 2015

(54) METHOD AND APPARATUS TO REDUCE NOISE CAUSED BY MODE HOPPING IN EXTERNAL CAVITY LASERS

(71) Applicant: Agilent Technologies, Inc., Loveland, CO (US)

(72) Inventors: Miao Zhu, San Jose, CA (US); Charles Hoke, Menlo Park, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/192,654

(22) Filed: Feb. 27, 2014

(51) Int. Cl.
| | |
|---|---|
| H01S 3/10 | (2006.01) |
| H01S 5/14 | (2006.01) |
| H01S 5/065 | (2006.01) |
| H01S 5/0683 | (2006.01) |
| H01S 5/026 | (2006.01) |

(52) U.S. Cl.
CPC .............. *H01S 5/141* (2013.01); *H01S 5/0261* (2013.01); *H01S 5/0267* (2013.01); *H01S 5/0651* (2013.01); *H01S 5/06832* (2013.01)

(58) Field of Classification Search
USPC ............................... 372/15, 20, 28, 31–32, 99
See application file for complete search history.

(56) References Cited

U.S. PATENT DOCUMENTS

| | | | |
|---|---|---|---|
| 2003/0058901 A1 | 3/2003 | Jacobowitz | |
| 2007/0047599 A1* | 3/2007 | Wysocki et al. | ................ 372/20 |

FOREIGN PATENT DOCUMENTS

| | | |
|---|---|---|
| WO | 01/59889 A1 | 8/2001 |

OTHER PUBLICATIONS

Office Action dated 28 May 2015, UK Application No. GB1420089.3.

* cited by examiner

*Primary Examiner* — Dung Nguyen

(57) ABSTRACT

An external cavity laser and method for operating same are disclosed. The external cavity laser includes a gain chip, a grating, an actuator and actuator driver. The grating diffracts light leaving the gain chip in a band of wavelengths back to the gain chip, the grating is characterized by an angle relative to light leaving the gain chip and distance from the gain chip, the angle and distance is controlled by the actuator. Part of the diffracted light is amplified by the gain chip. The actuator driver causes the angle to be dithered about an equilibrium angle in a motion characterized by an amplitude and average frequency. The amplitude of the dithering motion is chosen to either excite a plurality of adjacent laser modes of the gain chip or provide a servo signal for maintaining the grating angle at a target value.

20 Claims, 2 Drawing Sheets

METHOD AND APPARATUS TO REDUCE NOISE CAUSED BY MODE HOPPING IN EXTERNAL CAVITY LASERS

BACKGROUND

Lasers that have output wavelengths that can be tuned over a broad range of wavelengths are utilized in a number of instruments that measure the properties of a sample as a function of wavelength. One class of laser that is utilized in such instruments is based on a broad bandwidth gain chips that are placed in an external cavity that uses a grating as one of the "reflectors" in the external cavity. To tune the output wavelength, the position of the grating is adjusted to provide the desired laser cavity length and the angle of incidence of light on the grating is adjusted such that the grating selectively diffracts light of the desired wavelength back to the gain chip.

If the band of wavelengths that are diffracted back by the grating is sufficiently large, more than one mode of the laser cavity can be excited. In this case, the laser output light can hop between modes in an unpredictable pattern over time periods that are less than the time period over which measurements are being made by the instrument that utilizes the light from the laser. The hopping can be induced by any of a number of non-ideal factors such as changes in temperature. In a pulsed laser, insufficient grating resolution allows more than one laser cavity mode to satisfy the lasing conditions when a current pulse is applied to the gain chip. Although other physical mechanisms such as homogeneous gain broadening only permit one laser cavity mode to lase, the lasing cavity mode could be different from pulse to pulse. In a pulsed laser, the variations in temperature during the pulse can cause mode hopping (intra-pulse mode hopping). In addition, there are laser beam pointing errors associated with laser mode hopping. Because each laser cavity has a different frequency the angle of the diffracted light from the grating is different for each laser cavity mode.

A large number of measurements require tuning laser wavelengths repeatedly and good laser beam pointing stability during each measurement. For example, the background can be removed from the sample signal by measuring the background when the sample is absent. In these measurements, laser wavelength tuning repeatability is very important. Since the mode hopping can occur at random times, such variations cause problems for measurements that require a high degree of tuning repeatability and good laser beam pointing stability in the tuning of the laser wavelength.

SUMMARY

The present invention includes an external cavity laser and method for operating same. The external cavity laser includes a gain chip, a grating, an actuator and actuator driver. The grating diffracts light leaving the gain chip in a band of wavelengths back to the gain chip, the alignment of the grating is characterized by an angle relative to light leaving the gain chip and distance from the gain chip, the angle and distance is controlled by the actuator. Part of the diffracted light is amplified by the gain chip. The actuator driver causes the angle to be dithered about an equilibrium angle in a motion characterized by an amplitude and average frequency. The amplitude is sufficient to excite a first plurality of adjacent laser modes of the gain chip.

In one aspect of the invention, the actuator driver dithers the angle at an average frequency greater than 1 Hz. In another aspect of the invention, the actuator driver dithers the angle at a frequency that is a resonance frequency of a mechanical system that includes the grating.

In another aspect of the invention, the gain chip is pulsed at a first frequency, and the grating angle is dithered at a frequency less than the first frequency.

In a still further aspect of the invention, the external cavity laser includes a detector that measures a laser power and servos the actuator driver such that the peak of the diffraction function of the grating is aligned with the desired laser cavity mode.

In one aspect of the invention, a long focal length lens with a large numerical aperture is used to collimate the light beam on the grating to improve the selectivity of the grating.

DETAILED DESCRIPTION

Figure 1:
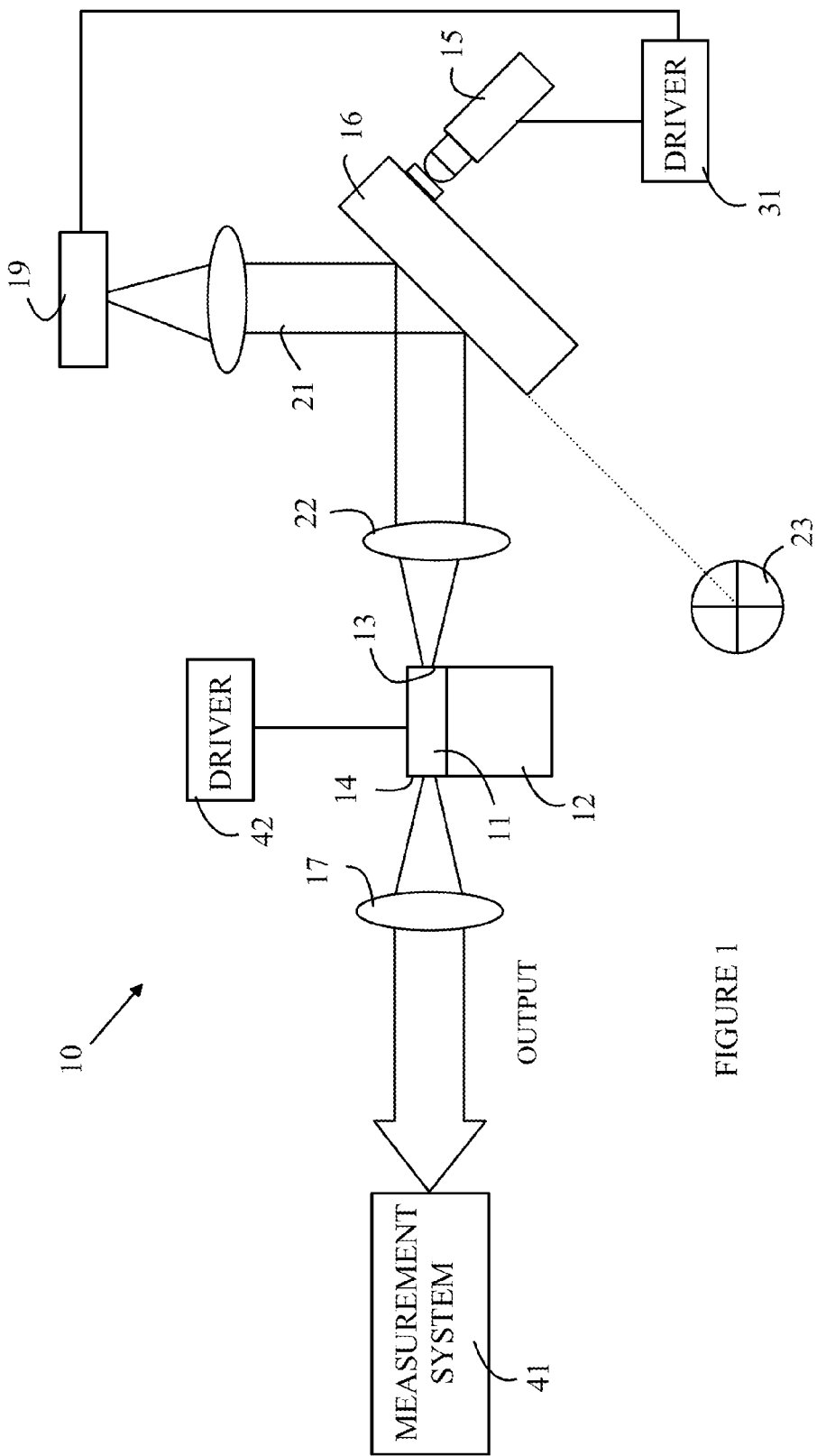
FIG. 1 illustrates an external cavity laser according to one embodiment of the present invention that supplies light to a measurement system.

The manner in which the present invention provides its advantages can be more easily understood with reference to FIG. 1, which illustrates an external cavity laser according to one embodiment of the present invention that supplies light to a measurement system 41. Laser 10 includes a gain chip 11 that is mounted on a mount 12. The laser cavity is defined by facet 14 of gain chip 11 and the grating surface. In an ideal system, the angle of diffraction grating 16 relative to the light beam from gain chip 11 is chosen to lock the laser on a particular mode. The angle is set by an actuator 15 that rotates the grating around an axis 23 that is chosen such that the wavelength of the diffracted light that returns to gain chip 11 and the length of the laser cavity are maintained to provide the desired output wavelength. Lens 17 collimates the output light to the desired beam size to provide the light that is to be used by the measurement system that utilizes laser 10 as its light source. Collimating Lens 22 collimates the light leaving front facet 13 of gain chip 11 to provide a collimated light beam having a diameter that is set to provide the desired wavelength resolution from diffraction grating 16. Increasing the number of grooves on diffraction grating 16 covered by the laser beam provides narrower wavelength bands in the diffracted light that reaches gain chip 11. To decrease the bandwidth of the light returned to the gain chip by the grating, a long focal lens (with a large numerical aperture) can be used to increase the size of the laser beam on the grating surface. In laser 10, an optional light output 21 is also generated and can be used to monitor the laser power using a detector 19. The use of detector 19 in stabilizing the laser mode being excited will be discussed in more detail below. Alternatively, an optical beam splitter in the output beam can be used to divert a fraction of laser power to a photo detector.

Figure 2:
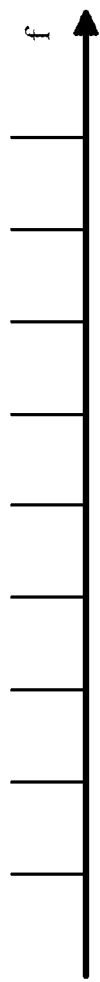
FIG. 2 illustrates the possible laser cavity modes as a function of the laser optical frequency.

Refer now to FIG. 2, which illustrates the possible laser cavity modes as a function of the laser optical frequency. It is often useful to use the laser optical frequency in discussions rather than the wavelength of the light from the laser, as the laser cavity modes are equally spaced as a function of optical frequency. Any band of wavelengths in the laser is equivalent to a corresponding band of optical frequencies. The frequency difference between two adjacent laser cavity modes is referred to as the free spectral range (FSR). The bandwidth of gain chip 11 is large compared to the FSR of the laser cavity; hence, some additional optical frequency selection element is needed to ensure that only one of the laser cavity modes lases. Examples of such optical frequency selective elements include diffraction gratings and dispersive prisms.

Figure 3:
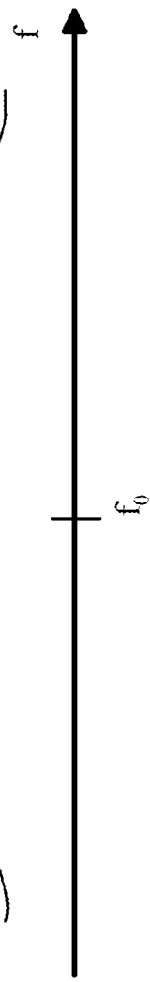
FIG. 3 illustrates the optical frequency selection provided by a diffraction grating.
Figure 4:
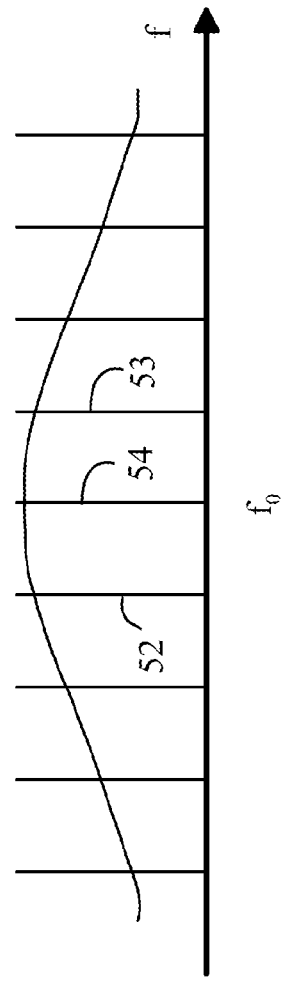
FIG. 4 illustrates the ideal relationship between the modes of the laser and the diffraction function of the grating.

Diffraction grating 16 shown in FIG. 1 provides the additional optical frequency selection. Refer now to FIG. 3, which illustrates the optical frequency selection provided by diffraction grating 16. The amplitude of the light in diffracted beam that returns to the gain chip as a function of optical frequency is shown at 51. This curve will be referred to as the diffraction function of the grating, or simply as the diffraction function, in the following discussion. The wavelength for which the diffraction function is maximum will be referred to as the diffraction function maximum. While the grating preferentially attenuates frequencies that differ from $f_0$, the amplitude of the diffracted light remains significant at frequencies displaced from $f_0$. Ideally, the desired laser mode is at $f_0$, and the amplitude of the diffracted light as a function of frequency is as shown in FIG. 4. In this case, the amplitude of the diffracted light at modes 52 and 53 is sufficiently reduced to ensure that only mode 54 lases.

Figure 5:
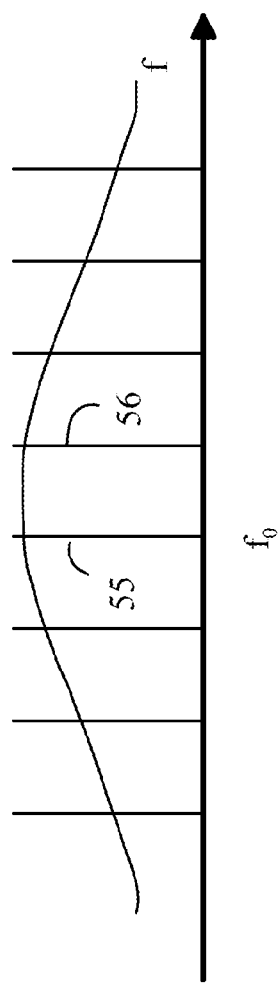
FIG. 5 illustrates the modes and diffraction function of the grating when the grating is not properly aligned.

In practice, misalignments between the diffraction function maximum frequency, $f_0$, and the laser cavity modes occur. Such a misalignment is shown in FIG. 5. In this case, both modes 55 and 56 can lase; although only one will lase at any given time. In addition, the mode that is lasing can jump back and forth between these two modes. In a pulse laser, when an electric current pulse is injected into the gain chip, the laser can lase in one of the modes 55 and 56. The misalignment of diffraction frequency $f_0$ and the laser cavity modes can result in laser pointing instability. For a given grating position, only one optical frequency, $f_0$, is perfectly aligned with the laser cavity. The light beam with a different optical frequency has a different diffraction angle when it returns from the grating. As a result, a mode with a different propagation direction can be excited. This is one of the origins of the laser beam pointing instability. In some cases, there is a waveguide in gain chip 11. The fundamental mode of the waveguide defines the laser beam propagating direction of the desired mode. In this structure, the light beam with a frequency different from $f_0$ diffracted by the grating back to the laser gain chip excites higher order transverse modes in addition to the fundamental mode of the waveguide of gain chip 11. In practice, the higher order waveguide modes cannot be completely suppressed by the waveguide which leads to a pointing instability of the output laser beam.

Referring again to FIG. 1, gain chip 11 has a broad gain bandwidth to support a large number of laser cavity modes that span a relatively large range of wavelengths. Gain chip 11 is driven by driver 42 that can be an electric current pulsed source. Light from the front facet 13 of gain chip 11 is diffracted from a diffraction grating 16. The angle of diffraction grating 16 relative to the light beam from gain chip 11 is chosen to select a particular laser cavity mode to lase. The angle is set by an actuator 15 that rotates the grating around an axis 23 that is chosen such that the wavelength of diffracted light that returns to gain chip 11 and the length of the cavity are maintained to provide the desired laser wavelength. Lens 17 collimates the output beam to the desired size to provide the output light that is used by the measurement system that utilizes laser 10 as its light source. Lens 22 collimates the light leaving front facet 13 of gain chip 11 to a diameter that is set to provide the desired wavelength resolution from diffraction grating 16. Increasing the number of grooves covered by the laser beam on diffraction grating 16 provides narrower wavelength bands in the diffracted light that reaches gain chip 11. One method to achieve this desired narrow wavelength band is to use a long focal length lens for lens 22 with a larger diameter to provide a larger collimated beam. Typically, the laser light emerging from front facet 13 diverges with an angle that is insufficient to fill a large lens placed near front facet 13. Hence, a long focal length lens that is placed further from front facet 13 is used to increase the beam diameter and thus increase the number of grooves on the grating that are covered by the laser beam.

The present invention is based on the observation that a reproducible laser output is more important for a number of applications than having the narrowest possible output wavelength spectrum. In such systems, a light source that generates a spectrum that includes a stable mixture of light from a plurality of adjacent modes that are centered on some desired "ideal mode" is preferable to a source having a spectrum that jumps unpredictably within narrower spectrums that collectively span the wavelength range between the modes in question.

In one aspect of the invention, actuator 15 is driven by driver 31 that produces a dithered drive signal that causes diffraction grating 16 to move back and forth about a equilibrium position during the time light is output by laser 10. The equilibrium position is preferably chosen such that the center wavelength of the diffracted light that reaches gain chip 11 is the wavelength of the desired laser cavity mode. In this aspect of the invention, several laser cavity modes have "equal" opportunity to lase averaged over time, and the measurements made by the instrument using laser 10 are based on the average of these modes. In this case, the dithering should be fast enough so that in a given dwelling time of the measurement there is sufficient averaging to provide a reproducible measurement.

The dithering can be periodic, or random, or pseudo-random. In the case of a periodic dithering as an example, the dithering frequency should be equal to or greater than the reciprocal of the dwelling time of the measurement that utilizes the light from laser 10. In one aspect of the invention, the dithering frequency is an integer multiple of the reciprocal of the dwelling time of the measurement that utilizes the light from laser 10. The dithering frequency must be chosen such that the signal does not interfere with the measurement system that utilizes the output of laser 10. For example, the frequency should not be near any characteristic frequencies of the measurement system that utilizes the light from laser 10. In addition, the driving signal should not have any harmonics that are near the characteristic frequencies in question. If laser 10 is run in a pulsed mode, the dithering frequency should also be less than the pulse frequency or the pulse repetition rate. For many practical cases, a dithering frequency between 10 Hz and 2 MHz is preferred. Lower frequencies require longer measurement times. Higher frequencies are preferred; however there are limits set by the mechanical system that is used to implement the actuator.

For the periodic dithering, the dithering waveform is not limited to sinusoidal waveforms. Other waveforms (triangle, saw-tooth, etc.) can also be used. For random, or pseudo-random, dithering, the dithering signal can be characterized by a low cut-off frequency, which can be DC, and a high cut-off frequency. These cut-off frequencies can be set when the dithering signal is generated electronically, or can be set by the nature frequency response of the electro-mechanical system. An average frequency (or center frequency) can be defined as the mean of the low cut-off frequency and the high cut-off frequency. An average frequency in the range of 5 Hz-1 MHz is preferred. Within the frequency range set by the cut-off frequencies, the dithering amplitude does not have to be a constant.

This dithering motion results in an averaging of the wavelength generated by laser 10 over a small band of wavelengths. The dithering amplitude is chosen to excite a plurality of adjacent laser cavity modes that would otherwise be reached by random mode hops. As a result, the output mode of the laser is averaged over these modes and is more stable after averaging in time. By averaging the modes, a signal that is reproducible is obtained at the expense of a small increase in the bandwidth of the light generated by the laser.

The amplitude of the dithering motion determines the modes that are included in the laser output, the larger the amplitude, the larger the number of modes that are included in the output. Consider a band of frequencies represented by a band of adjacent modes. The dwell time on any particular mode in the center region of the band will be more reproducible than the dwell time of the modes on the edges of the band, since the bands on the edges are not reproducibly excited on each dither. Accordingly, there is a tradeoff between the number of modes that are averaged and the reproducibility of the laser output spectrum. Hence, the number of modes over which the averaging occurs should be sufficiently large to ensure that most of the energy in the output light comes from modes that are internal to the band rather than on the edge of the band. However, too wide a band of modes leads to frequency degradation in the output spectrum of the light source. In one aspect of the invention, the dither amplitude is chosen such that the number of modes over which averaging occurs is between 10 and 50. In one embodiment, the number of modes is chosen to be greater than 20. However, embodiments in which the number of modes over which averaging occurs is greater than 5 but less than 10 can also be advantageous in some measurement contexts.

In one aspect of the invention, the dithering frequency is chosen to be equal to the frequency of a resonance of the mechanical system comprising the grating and the associated parts. In this regard, it should be noted that the arm that connects the grating to axis 23 in FIG. 1 is for illustration. In many designs there is no physical arm to connect the grating to the "virtual" axis 23. A frequency that is a harmonic or a sub-harmonic of such a mechanical resonance could also be utilized. This arrangement is advantageous in systems in which efficient coupling of the dithering signal to the mechanical system is important. The dithering frequency is preferably a sub-harmonic of the laser repetition frequency. In one aspect of the invention, the dithering frequency is an even sub-harmonic of the laser repetition frequency.

A random dithering signal or a pseudo-random dithering signal has the advantage of being less likely to excite any resonances in the measurement system. In the case of a random dithering signal, the above-mentioned average frequency is the number of changes in amplitude direction per second. If a random dithering signal is utilized, a white noise source can be used to drive actuator 15 about its equilibrium position. The amplitude of the noise source is set to provide the averaging of the modes in a manner analogous to that of the periodic drive source discussed above.

In another aspect of the invention, the frequency of the peak of the diffraction function of the grating is aligned with the desired laser cavity mode using a servo system. Here the grating dithering amplitude is small in comparison with the laser cavity FSR. In one embodiment, the grating dithering amplitude only covers a fraction of the laser cavity FSR. Embodiments in which this fraction is less than 50 percent and preferably less than 15 percent of the laser cavity FSR are particularly useful. Detector 19 measures the laser power and a servo system adjusts actuator 15 keep the measured power at a maximum power, and hence, maintain the alignment of the peak of the grating diffraction function and the desired laser cavity mode. Refer again to FIG. 4 which illustrates a correctly aligned grating. If the grating diffraction function moves slightly in frequency, the laser power will decrease. Hence, if the grating is dithered about the current position, and the equilibrium position is adjusted to maintain the maximum output power, the laser will remain lasing on the desired laser cavity mode.

Refer now to FIG. 5. Only one of laser cavity modes 55 and 56 will be lasing at any given time. For the purposes of this discussion, assume mode 55 is lasing. The servo system will attempt to move the grating angle such that the power will be at a maximum. Hence, the grating will be adjusted such that diffraction curve peak is moved to a lower frequency. That is, the grating will be positioned such that the diffraction curve now has its maximum at mode 55.

As noted above, in such embodiments, the dithering amplitude must be small to prevent the dithering from causing a mode hop. That is, the dithering amplitude should be less than the amplitude that would cause the frequency of the diffraction function maximum to shift by more than the free spectral range. In one exemplary embodiment, the dithering amplitude is set such that the change in frequency of the peak of the diffraction curve is less than half of the free spectral range.

The selectivity of the grating in the servo-based embodiments determines whether those embodiments can be successfully implemented. If the grating attenuation of optical frequencies of modes near the desired mode is insufficient, then mode hopping can occur even with the feedback mechanism adjusting the position of the maximum of the diffraction curve. As noted above, the selectivity of the grating can be improved by increasing the size of the beam diameter on the grating such that more grating grooves are covered by the light. To increase the beam diameter, a larger collimating lens must be used; however, the lens must be moved to a distance from the gain chip that is sufficient to ensure that the light from the gain chip fills the lens. In prior art designs, lens 22 is typically a less than 3.2 mm focal length lens with a diameter of less than 7 mm. This arrangement results in a collimated laser with a diameter less than 7 mm. In one aspect of the present invention, lens 22 is a 6.5 mm focal length lens with a diameter of 15 mm. In this case, the grating wavelength selection bandwidth decreases by more than a factor of 2 if the groove density of the grating is the same.

In the above-described embodiments, a grating is used for the optical frequency selective element that locks the gain chip to one of its modes. However, other optical selection optical element(s) such as a prism or prisms can also be used in the external cavity laser to provide the selective attenuation of the light leaving the gain chip.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. An apparatus comprising:
a gain chip;
an optical frequency selective element that sends selectively attenuated light leaving said gain chip as a function of optical frequency in a band of wavelengths back to said gain chip, said optical frequency selective element being characterized by an angle relative to light leaving said gain chip and distance from said gain chip, said angle and said distance being controlled by an actuator, a part of said light from the said optical frequency selective element being amplified by said gain chip; and
an actuator driver that causes said angle to be dithered about an equilibrium angle in a motion characterized by an amplitude and average frequency.

2. The apparatus of claim 1 wherein said optical frequency selective element comprises a grating that diffracts light leaving said gain chip in a band of wavelengths back to said gain chip, said grating being characterized by an angle relative to light leaving said gain chip and a distance from said gain chip, said angle and said distance being controlled by said actuator, a part of said diffracted light being amplified by said gain chip.

3. The apparatus of claim 2 wherein said amplitude is sufficient to excite a plurality of adjacent laser cavity modes of said gain chip.

4. The apparatus of claim 3 wherein said plurality of adjacent laser cavity modes is greater than ten adjacent laser cavity modes.

5. The apparatus of claim 3 wherein said plurality of adjacent laser cavity modes is greater than five.

6. The apparatus of claim 3 wherein said plurality of adjacent laser cavity modes is less than 50.

7. The apparatus of claim 2 wherein said actuator driver causes said angle to be dithered at an average frequency greater than 1 Hz.

8. The apparatus of claim 2 wherein said actuator driver causes said angle to be dithered at an average frequency greater than 10 Hz.

9. The apparatus of claim 2 wherein said actuator driver causes said angle to be dithered at a frequency that is a resonance frequency of a mechanical system that includes said grating.

10. The apparatus of claim 2 further comprises a detector that measures a power of light generated by said apparatus and that servos said actuator such that said measured power is maintained at a maximum power.

11. The apparatus of claim 10 wherein said grating is characterized by a diffraction curve as a function of frequency for light amplified by said gain chip, wherein said laser cavity is characterized by a free spectral range, and wherein said angle is dithered such that a maximum of said diffraction curve is dithered by an amount less than said free spectral range of said laser cavity.

12. The apparatus of claim 11 wherein said angle is dithered such that a maximum of said diffraction curve is dithered by an amount less than half of said free spectral range of said laser cavity.

13. The apparatus of claim 2 wherein said gain chip is pulsed at a first frequency and wherein said average frequency is less than said first frequency.

14. The apparatus of claim 13 wherein said average frequency is a sub-harmonic of said first frequency.

15. The apparatus of claim 14 wherein said average frequency is an even sub-harmonic of said first frequency.

16. The apparatus of claim 2 further comprising a collimating lens that generates a collimated light beam from light leaving said gain chip prior to that light striking said grating, said collimated light beam having a diameter larger than 10 mm.

17. The apparatus of claim 16 wherein said collimating lens has a focal length larger than 4.4 mm.

18. A method for operating a laser comprising a gain chip, a grating, and an actuator, said grating diffracting light leaving said gain chip in a band of wavelengths back to said gain chip, said grating being characterized by an angle relative to light leaving said gain chip and distance from said gain chip, said angle and said distance being controlled by said actuator, said method comprising operating said actuator to cause said angle to be dithered about an equilibrium angle in a motion characterized by an amplitude and average frequency.

19. The method of claim 18 wherein said amplitude is sufficient to excite a plurality of adjacent laser cavity modes of said gain chip.

20. The method of claim 18 further comprising measuring a power of light generated by said laser and adjusting said actuator such that said measured power is maintained at a maximum power, wherein said grating is characterized by a diffraction curve as a function of frequency for light amplified by said gain chip, wherein said laser cavity is characterized by a free spectral range, and wherein said angle is dithered such that a maximum of said diffraction curve is dithered by an amount less than said free spectral range of said laser cavity.

* * * * *